United States Patent [19]

Fichtner

[11] 4,037,141
[45] July 19, 1977

[54] ENERGY CONSERVATION SYSTEM

[75] Inventor: Robert L. Fichtner, Livermore, Calif.

[73] Assignee: Select Energy Systems, Inc., Moraga, Calif.

[21] Appl. No.: 701,533

[22] Filed: July 1, 1976

[51] Int. Cl.² .......................................... H01H 47/20
[52] U.S. Cl. .................................. 361/182; 307/129
[58] Field of Search ................ 317/147, 141; 307/114, 307/129, 140; 340/147 R

[56] References Cited

U.S. PATENT DOCUMENTS

| 3,440,347 | 4/1969 | Spencer et al. | 317/147 UX |
| 3,586,919 | 6/1971 | Harris | 317/147 |
| 3,590,271 | 6/1971 | Peters | 317/147 X |

Primary Examiner—R. N. Envall, Jr.
Attorney, Agent, or Firm—Phillips, Moore, Weissenberger, Lempio & Majestic

[57] ABSTRACT

An energy conservation system is disclosed wherein power in a given area, such as in a hotel or other room, is controlled by means of an ultrasonic sound transmitter and a plurality of ultrasonic sound receivers, each receiver controlling power for a separate power outlet. Upon entering the room, a key is inserted into a key receptacle to activate the transmitter and thereby cause the receivers to couple power to the power outlets in the room. When the key is withdrawn from the key receptacle, the transmitter signals the receivers to decouple power from the power outlets.

14 Claims, 4 Drawing Figures

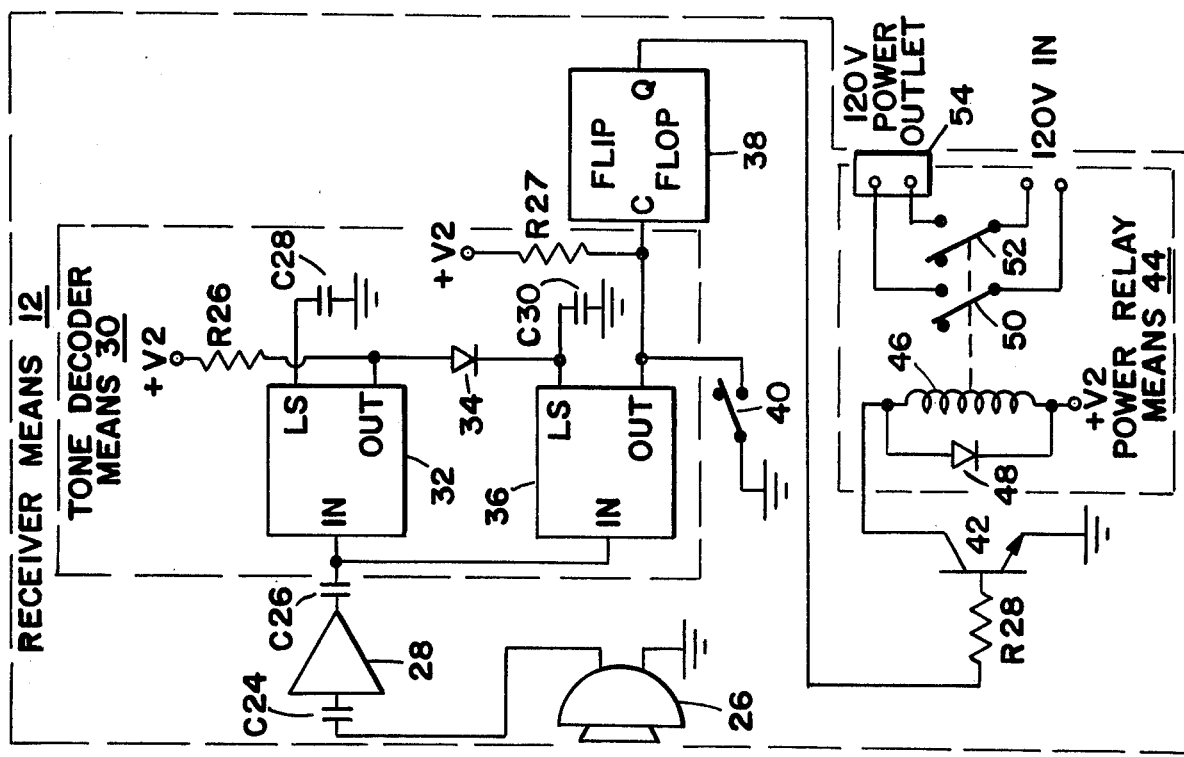
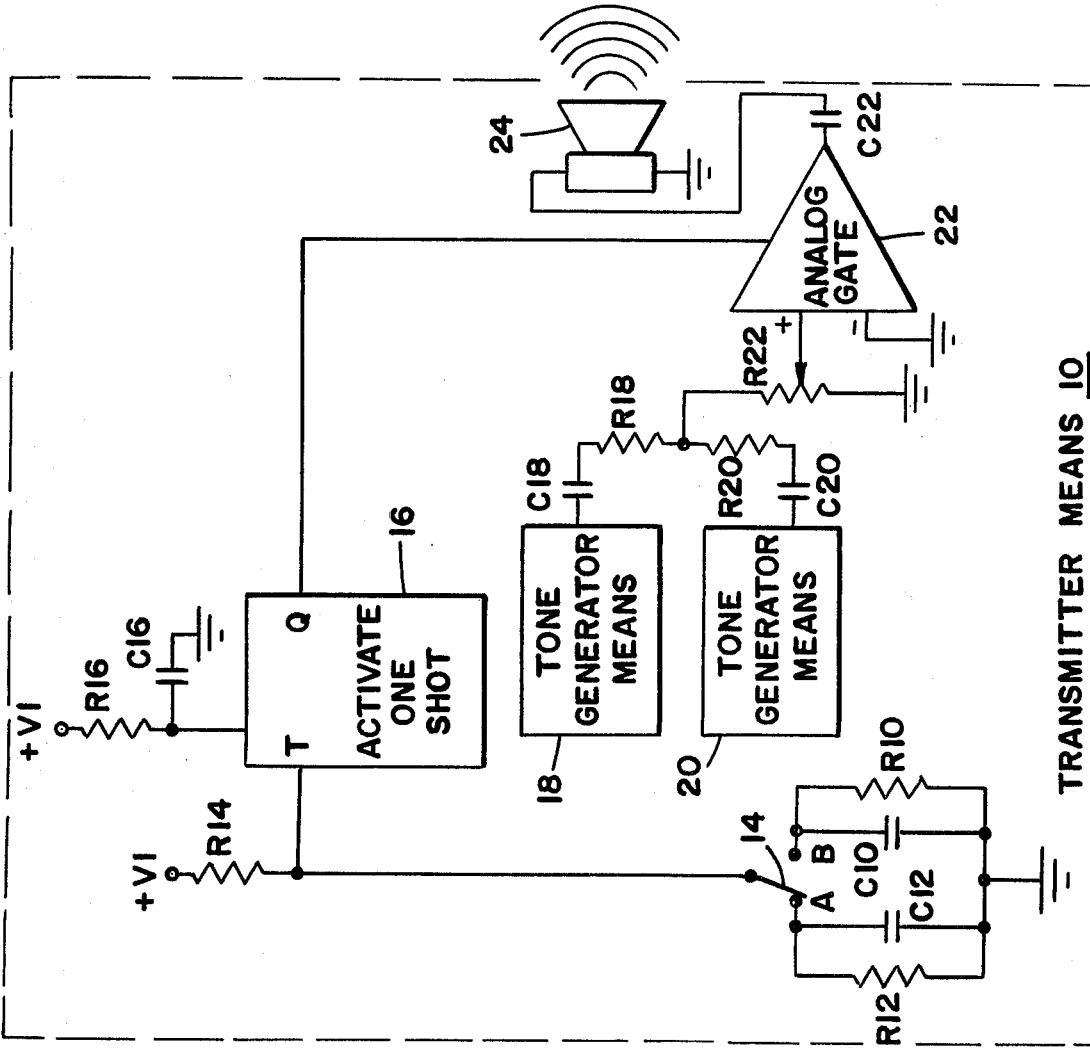
FIG_1

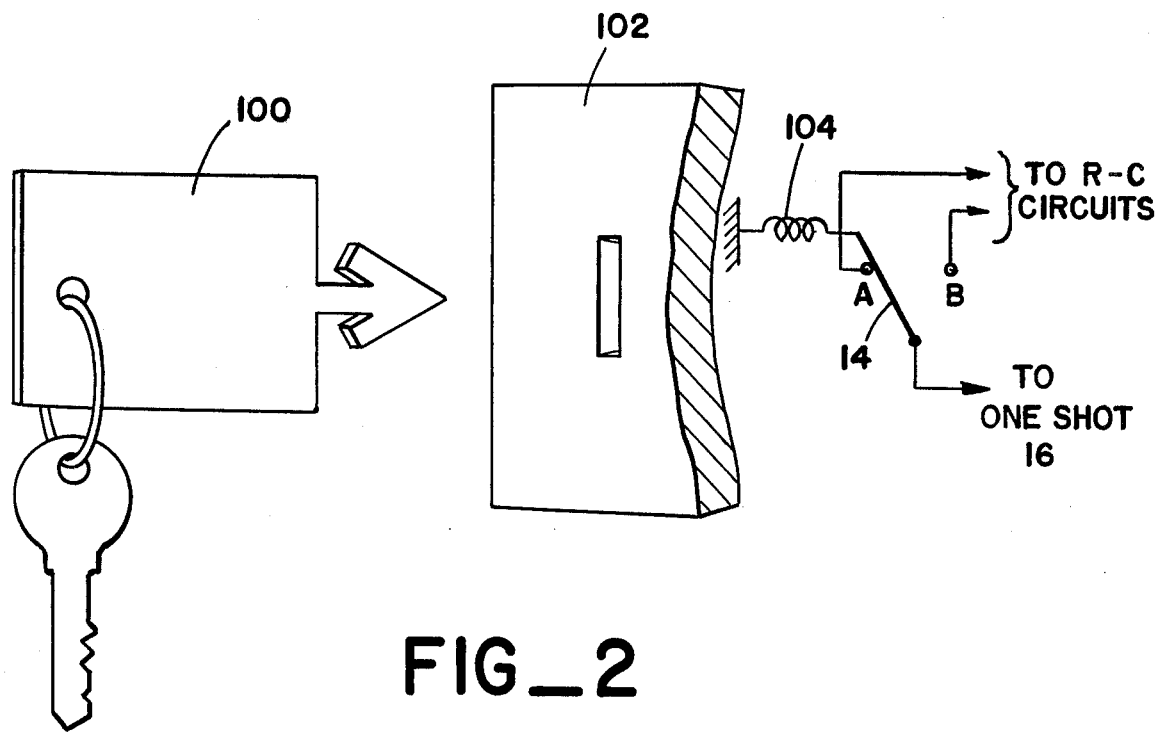
FIG_2
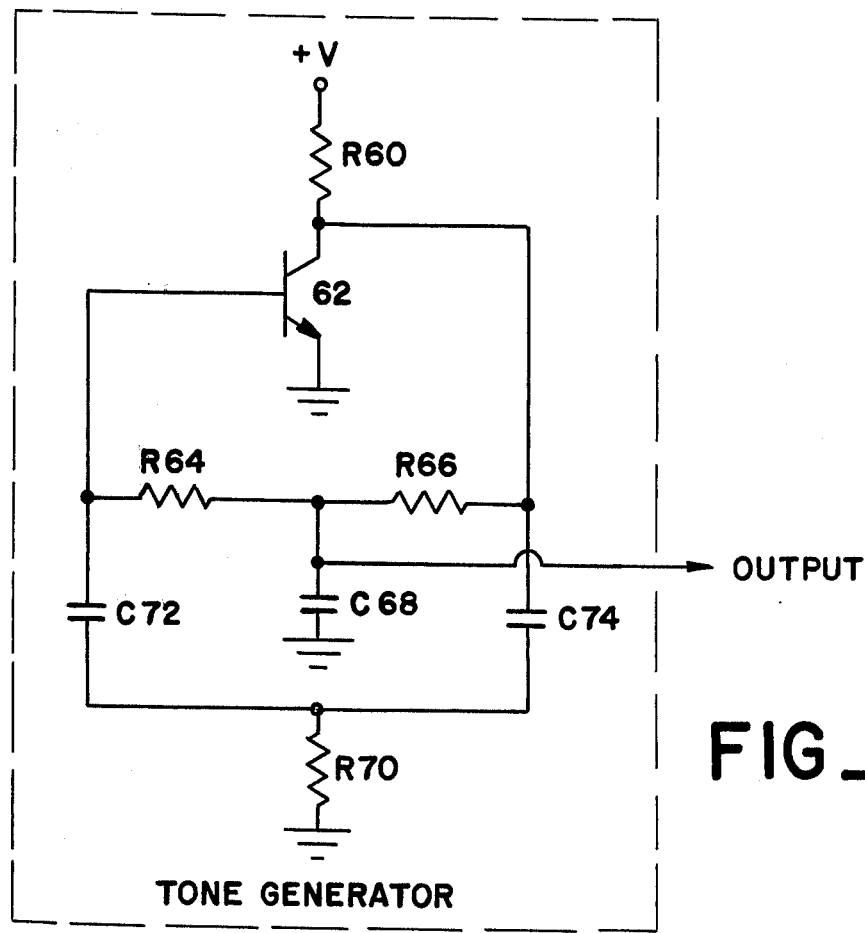
FIG_4

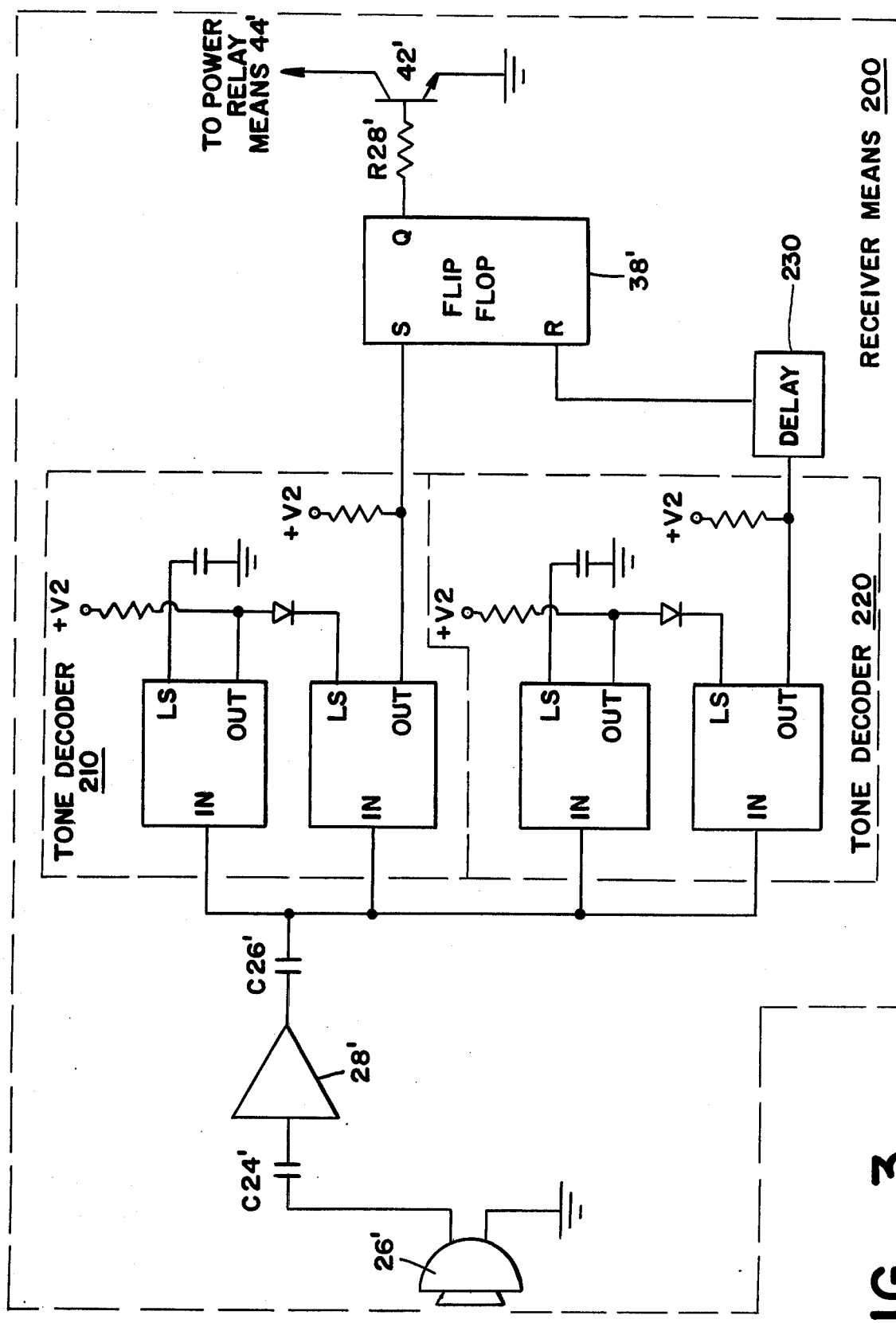
FIG_3

ENERGY CONSERVATION SYSTEM

BACKGROUND OF THE INVENTION

1. Field of the Invention

The present invention relates in general to energy conservation systems and more specifically to a system for controlling the coupling of power to a given area by means of a key-operated ultrasonic sound transmitter and one or more receivers associated therewith.

2. Description of the Prior Art

Prior art devices have used a radio receiver to remotely control the source of power for lighting. See, e.g., U.S. Pat. No. 2,346,889. No prior art has been found, however, wherein ultrasonic sounds are used instead of radio waves in such an application. Nor has there been found any prior art wherein control of power in a given room is controlled by a transmitter and one or more receivers in that room. Such devices would have been impractical in the past due to their bulkiness and cost; factors that have ameliorated greatly with the advent of electronic integrated circuits.

The use of an ultrasonic sound signal versus a radio wave is also much more useful because a given ultrasonic sound transmitter has a localized output which will not turn on a receiver that is in another room; the sound waves are contained in the room by the walls which absorb the sound waves. No such limitation attaches to radio waves, so that for such a system, localization of a transmitter signal in a given room is much more difficult and expensive. Such localization is critically important in the operation of the present invention, for example, since one use of the system would be in hotel rooms where power in adjacent rooms would be controlled by separate independent systems according to the present invention.

SUMMARY OF THE INVENTION

The present invention is a system for controlling power use in a given room. A key must be placed in a key receptacle before power in the room is enabled. When the key is subsequently removed from the receptacle, power goes off again. Preferably, the same key used to gain access to the room, or a second key attached therewith, is required to be used in the key receptacle, so that when a user leaves the room and desires to lock the door behind him, he is forced to remove the key from the receptacle. He thereby disconnects power automatically from all power outlets in the room.

The system uses an ultrasonic sound transmitter and one or more ultrasonic receivers tuned to the output signal of the given transmitter. The transmitter is activated by the insertion of the key into a key receptacle. The key closes a switch, which causes a plurality of tone signals, produced by tone generators in the transmitter, to be coupled across an analog gate to an output speaker. The receivers in the room then detect the sound signal generated by the speaker. Each receiver amplifies this signal and feeds it to tone decoder means which determines whether or not the proper frequency tones have been received. If the correct tones are recognized, an output signal from the tone decoder means causes a power relay to turn on to thereby couple power to respective power outlets in the room. Subsequently, when the key is removed from the receptacle, the transmitter signals this condition to the receivers in the room in the same manner as described above, the receivers acting in response thereto to de-energize the power relay, thereby disconnecting power from the power outlet.

Therefore, a primary object of the present invention is to control the power available in a given area by means of a key and key receptacle.

Another object of the present invention is to provide a system that requires a person to remove the key from a key receptacle, to thereby turn off the lights, t.v., etc. in the room, if that person wants to lock the room and take the key with him when he leaves.

A further object of the invention is to provide a system whereby the activating signal stays within a given room and does not affect systems in adjacent rooms.

Another object of the present invention is to provide a system for simply yet effectively enabling a person to turn on or off all power usage elements at one time.

A still further object of th present invention is to provide a system whereby only a short burst of tones is required to actuate power in a room when the key is inserted in the key receptacle, and requiring the same or a different burst of tones to deactivate power in the room when the key is removed from the receptacle, such that no high frequency sound waves exist in the room at all other times during which it is occupied.

Another object of the present invention is to provide a system whereby no possibly damaging radio waves emanating from a transmitter in a given room are used, but instead much safer sound waves are used.

A further object of the present invention is to provide a simple means for adding an energy saving system to existing rooms without requiring any radical wiring changes therein.

Other objects and advantages of the present invention will become more readily apparent upon reference to the accompanying drawings and following description.

BRIEF DESCRIPTION OF THE DRAWINGS

FIG. 1 is an electronic schematic, in block diagram form, illustrating the essential circuit components of both the ultrasonic transmitter and a representative receiver of the current invention;

FIG. 2 is a schematic illustration of a key unit and key unit receptacle means for the current invention;

FIG. 3 is an electronic schematic, in block diagram form, of a second embodiment of the receiver means of the current invention; and FIG. 4 is a detailed schematic of a representative tone generator of the current invention.

DESCRIPTION OF THE PREFERRED EMBODIMENT

An energy conservation of saving system according to the present invention is illustrated in FIG. 1. Shown is an ultrasonic sound transmitter means 10 and a representative one of a plurality of ultrasonic sound receivers constituting a receiver means 12.

The transmitter 10 is activated by a switch 14. As shown in FIG. 2, switch 14 is designed to change state in one direction, to pole B, when a key unit 100 is inserted into a key unit receptacle 102. The switch 14 is designed to change back in the other direction to its original state against pole A when the key unit 100 is removed from the receptacle. Thus, pole B would represent the activate or the power on state of the switch 14 and pole A would represent the deactivate or power off state of the switch 14.

Note that the key unit 100, receptacle 102, and the switch 14 can take on many different forms, e.g., they could comprise a standard key and key lock including a common switch means associated with the lock. An automobile ignition switch, for example, provides such a function. Many such ignition switches don't allow the key to be removed while the switch is on. It is within the state of the art to incorporate such a device as part of the current invention. Similarly, the switch 14 function could be obtained if the switch 14 had a spring biasing means 104 attached thereto, such that the switch 14 would always return to the power off or pole A state when the key unit 100 was removed. Also, such a key lock could be designed such that the same combination key used to unlock the door to the room would be needed to "unlock" the key lock receptacle in that room, to activate the associated switch 14.

Referring again to FIG. 1, when one wants to activate the transmitter 10, switch 14 is switched to pole B. As is seen, this couples a formerly isolated R-C circuit R10, C10 to a pull up resistor R14 and to the trigger input T of an activate one shot 16. This R-C circuit causes the input T of one shot 16 to go to a low state and then begin to increase in voltage level back to its original state as a function of the charging rate of capacitor C10. The one shot 16 doesn't change state until capacitor C10 has had an opportunity to charge up to the trigger threshold voltage required to fire the one shot 16. When this threshold is reached, the one shot fires and generates an output pulse at its output line Q having a duration, as is commonly known in the art, which is a function of the time constant of the R-C circuit R16, C16 connected to the one shot 16. In the present embodiment, the one shot 16 is an NE555 one shot, R16 is a 5 megohm resistor, and C16 is a 0.47 microfarad capacitor. The function of the one shot 16 is to control an analog gate 22 which functions to allow the transmitter means 10 to output a sound signal only during the time the one shot 16 has fired and is on.

While the switch 14 is against pole B, the other R-C circuit R12, C12 functions initially to discharge capacitor C12 through resistor R12. When the switch 14 is thrown back to pole A, the capacitor C12 has no charge. Thus, it is caused to charge up, as C10 had done above, to thereby again activate the activate one shot 16. Therefore, the two R-C circuits C10, R10 and C12, R12 act to turn on one shot 16 whenever the switch 14 changes state. In the present embodiment C10 and C12 are 0.001 microfarad capacitors and R10 and R12 are 1 megohm resistors.

Two tone generators are shown at 18 and 20 in FIG. 1. One tone generator might be tuned, for example, to output a frequency tone of 40 kHz, with the other generator tuned to output a 30 kHz signal. Note that in the present embodiment, power is continuously supplied to the tone generators 18, 20 to prevent any warmup drift in the frequencies generated. The output frequency signals from these tone generators 18, 20 are bridged together through 1 megohm resistors R18 and R20 and through a variable resistor R22 to the non-inverting input of the analog 22. The capacitors C18 and C20 merely act as coupling capacitors for the signal from each tone generator to the analog gate 22 to ensure that no D C components of the signal are allowed to pass. The variable resistor R22 functions to provide a means for adjusting the signal strength output of the analog gate.

The output of the analog gate 22 reflects the output of the two tone generators 18, 20 as described above, when one shot 16 is on. This gate 22 output is coupled through a capacitor C22 to a speaker means 24. As a result, the resistor R22 functions to also control the signal strength of the sound signal that emanates from the speaker 24. In the present embodiment, the speaker means 24 is a common ultrasonic transducer.

FIG. 4 illustrates one example of a tone generator circuit that is utilizable with the present invention. This tone generator circuit consists of a "twin T" oscillator that uses a low pass network R64, R66, and C68 and a high pass network R70, C72 and C74. As the phase shifts are opposite for each network, there is only one frequency at which the phase shift is 180° between the collector and base of transistor 62. This gives feedback supportive of oscillation at this frequency. R60 is merely a 3.3 kilohm biasing resistor for the transistor 62.

An output signal from the transmitter means 10 made up of two separate frequency tones was chosen for two reasons. First, if only one tone were used, there would be much greater noise sensitivity. Short bursts of high frequency audio noise are not uncommon. Thus, to maximize as much as possible noise insensitivity while keeping the price of the system at a reasonably low level, a system having an output of two tones was found to be optimum. Note however, that a similar result could be obtained by using two tone generators of the same frequency, but wherein one generator produces an output shifted in phase from the output of the other generator. Other tone generator schemes are equally well known in the art and are thus made a part of the present invention.

The receiver means 12 also is illustrated in FIG. 1. Each receiver 12 includes a microphone means 26 whose output is amplified by an input amplifier means 28. The output of this unit is fed into tone decoder means 30. If the proper tones are detected by the decoder 30, it outputs a signal to a flip-flop 38 which acts in response thereto to either turn on or turn off a power relay means 44 and thereby couple or decouple a 120 volt AC power line to the power outlet means 54.

Specifically, a standard crystal microphone 26 is used to detect the audio signals outputted by the transmitter means 10. The output of this microphone 26 is fed through a coupling capacitor C24 to an input amplifier means 28. The present embodiment uses an FET biased as an amplifier, and such amplfiers are well-known in the art. The amplifier 28 amplifies the signal detected by the microphone 26, and feeds the amplified signal output through a coupling capacitor C26 to the tone decoder means 30. The tone decoder means 30 comprises a plurality of standard phase locked loop circuits, one each for every tone to be detected by the receiver means 12. In the present embodiment, since two tones are used, two phase lock loop circuits (PLL's) 32, 36 are used. As is seen in FIG. 1 the output of the amplifier 28 is fed into each of these PLL's 32, 36. Note that each PLL 32, 36 requires a tone having a sufficient duration to allow it to lock on to the tone. As a result, the PLL's 32, 36 thereby also act as a filter to protect the system from erroneously activating. Further, each PLL 32, 36 acts to lock on only to tones having a frequency within a set bandwidth of their capture frequency.

To insure that the tone decoder means 30 only provides an output when both tones are detected, the output of PLL 32 is fed into the PLL 36 such that only when the proper tone is detected by the PLL 32 is the PLL 36 enabled to lock in on its proper tone. The output line of the PLL 32 is held high by a pull up resistor R26 until its proper tone is detected. At this point, the line goes low, thereby reverse biasing diode 34 and causing the last stage (LS) line of the PLL 36 to activate. The LS line for both the PLL's 32, 36 has a capacitor C28 and C30 respectively connected to it to act as a low pass filter for the output stage of the PLL. When the PLL 32 has not detected the proper frequency tone, the diode 34 is forward biased to thereby lock off the last stage of the PLL 36.

Thus, when both PLL's 32 and 36 have detected their proper tone, the out line of PLL 36 goes low, since this line normally is held high by the pull up resistor R27. This output feeds the clock input of a flip flop 38. As a result, when the PLL 36 detects its tone, it goes low for the duration of the tone signal. When the tone frequency audio input to the receiver 12 ends, to thereby turn off this PLL 36 signal, the rising edge of this pulse enables the flip flop 38 to change state. Note that when the receiver 12 is first turned on, there must be a means for initializing this flip flop 38 so that it is in the proper state for turning on and turning off the power to the power outlet means. If this were not provided, the insertion of a key unit 100 into a receptacle 102 could act to turn off the lights instead of the desired turning on of the lights in a given room. Therefore, a simple switch 40 is added to the clock input of the flip flop 38 so that if the flip flop 38 is in the wrong state when power to the receiver means 12 is initially turned on, merely by toggling this switch momentarily, one will produce the desired clock pulse for reversing the flip flop 38's state.

The Q output of flip flop 38 is coupled to a relay driver circuit and thereby to the power relay means 44. This driver circuit comprises a resistor R28 and transistor 42 connected in a conventional manner. The collector of the transistor 42 is connected to the coil 46 of the power relay means 44 so that when the flip flop 38 is on, the transistor 42 conducts, to thereby energize the coil 46 and turn on the power relay means 44. The diode 48 is added merely to prevent unwanted current spikes when the coil is turned off again. Thus, when the flip flop 38 is energized, the 120 volts AC that is connected to switches 50 and 52 is caused to be coupled through these switches to the 120 volt power outlet means 54. Subsequently, when flip flop 38 changes state again, the transistor 42 discontinues, conducting. This de-energizes the coil 46, causing the switches 50, 52 to return to their normally closed state, to thereby cut off power to the power outlet means 54.

Since each receiver 12 comprises only one relay, a few integrated circuits, and some other small components, it can be seen that the entire unit can be installed right at a given power outlet means. Thus, in a given room, any number of such receives can be installed at the user's option wherever any power is used, e.g. to control the coupling of power to one or more lights, to a t.v., or to any other power usage elements in the room. Also, the transmitter 10 is easily installable in that usually in a given room there is a light switch near the door. The transmitter 10 of the present invention is designed such that it can be installed in place of the normal room light switch. Therefore, the present invention is easily installable in any room such that one can optionally control any or all power outlets, i.e. power use elements, therein.

The preferred embodiment of the present invention uses a transmitter having two tone generators. The output of these generators is gated out in tone bursts to either activate or deactivate the receivers in a given room, depending on the state of the flip flop 38. In other words, the same tone burst is generated by the transmitter 10 when the key 100 is inserted into the receptacle 102 as when it is removed from the receptacle. Besides the noise sensitivity aspect noted previously, the tone generator scheme just described has been designed also for cost considerations.

It is further within the scope of the present invention to use two sets of two tone generators, wherein one set of tone generators is used to turn on the power outlet relay means via a receiver 12, and a second set of tone generators is used to turn off the power outlet relay means. The receiver of such an apparatus is illustrated in FIG. 3 and described in more detail herein below. A four tone generator transmitter similar to the transmitter 10 is not disclosed, however, because it is considered to be obvious to a person skilled in the art to add a second one shot and switch means similar to one shot 16 and switch 14 and a second set of tone generators and analog gate means as was described above for the transmitter 10, such that a four tone transmitter 10 is created thereby.

Referring now to FIG. 3, the audio signal received by a four tone decoder receiver means 200 is initially handled similarly to the above described receiver 12. A microphone 26' detects the audio signal which is then coupled through a capacitor C24' to an input amplifier 28'. The output of this amplifier is coupled through a coupling capacitor C26' to the tone decoder means. In this embodiment, however, the tone decoder means comprises two separate tone decoders, tone decoder 210 and tone decoder 220. Tone decoder 210 operates similarly to the tone decoder 30 in receiver 12. When a key 100 is inserted into the receptacle, a tone burst is transmitted by a transmitter. This tone burst is made up of two tones, such tones being decodable by the decoder 210. When a tone burst is detected, the decoder 210 outputs a signal to the set input of flip flop 38' to cause the Q output of this flip flop 38' to go on. Since decoder 220 does not see the two tones in the tone burst that it is tuned for, it remains idle. As in receiver 12, when the Q output of the flip flop 38' goes on, a power relay means 44' thereby becomes actuated to couple power to power outlet means 44' (not shown in FIG. 3). Now, however, when the key 100 is removed from the receptacle 102, a different tone burst is transmitted by the transmitter. In this case, decoder 220 is activated and decoded 210 remains idle. The output of decoder 220 is coupled to the reset input of flip flop 38' to cause it to reset and thereby deactivate the power relay means 44'. Note that a delay 230 could be added by a person skilled in the art, between the decoder 220 and the flip flop 38' to provide a short delay, 5 seconds for example, to enable whoever is deactivating the power in a given room to leave the room before the power usage elements, such as the lights, in fact go off.

I claim:
1. An energy conservation system comprising:
ultrasonic sound transmitter means;
a key unit;
a key unit receptacle arranged to receive said key unit and to signal said ultrasonic sound transmitter means upon said initial insertion of said key unit into said receptacle, said transmitter acting in response thereto to output a sound signal having a plurality of frequency tones therein;

power outlet means; and ultrasonic sound receiver means including means for controlling the coupling of power to said power outlet means, said receiver means, upon sensing said output sound signal of said transmitter means, acting in response thereto to couple power to said power outlet means.

2. The system of claim 1 wherein said ultrasonic transmitter means if further signaled upon the removal of said key unit from said receptacle, said transmitter acting in response thereto to output a sound signal; said receiver means acting in response thereto to decouple power from said power outlet means.

3. The system of claim 2 wherein said transmitter means comprises:
a plurality of tone generators;
speaker means;
means for gating one plurality of output tones from one group of tone generators to said speaker means such that said tones activate said speaker means upon insertion of said key unit into said key unit receptacle; and
means for gating a second plurality of output tones from a second group of tone generators to said speaker means suchs that said tones activate said speaker means upon removal of said key unit from said key unit receptacle.

4. The system of claim 2 wherein said transmitter comprises:
a plurality of tone generators, each defined to have an output tone frequency different from each other of said tone generators;
speaker means; and
means for gating said plurality of output tones from said tone generators to said speaker means such that said tones activate said speaker means, upon insertion of said key unit into said key unit receptacle and upon removal of said key unit from said key unit receptacle.

5. The system of claim 4 wherein said means for gating said plurality of output tones comprises a one shot and analog gate means controlled by said one shot, said one shot being caused to fire and to thereby open said analog gate for a specific period of time upon the detection by said one shot of said key unit receptacle key unit insertion signal and key unit removal signal.

6. The system of claim 2 wherein said transmitter comprises means for adjusting the strength of the signal outputted by said transmitter means.

7. The system of claim 2 wherein said receiver means further comprises:
microphone means for detecting the sound signals produced by said transmitter means and to output a signal in response thereto;
input amplifier means for amplifying the output of said microphone means; and
tone decoder means for detecting the amplified signal from said input amplifier means and for determining whether said signal includes the said plurality of frequency tones generated by said transmitter means; and to output a signal in response thereto if said tone frequencies are detected; said means for controlling the coupling of said power to said power outlet means responding thereto, such that said means is caused to activate.

8. The system of claim 7 wherein said means for controlling the coupling of power to said power outlet means comprises:

a flip flop for changing state in response to said tone decoder output signal; and
power relay means whose state is controlled by the state of said flip flop, said relay acting to switchably couple power to said power outlet means when said flip flop is in one state, and acting to switchably decouple power from said power outlet means when said flip flop is in its other state.

9. An energy conservation system for controlling power outlets in a given area or room comprising:
a key unit;
a key unit receptacle;
a power source;
power outlet means in said given room;
an ultrasonic sound transmitter including two tone generators of different frequency, a one shot, analog gate means, and speaker means;
switch means, said switch means changing state when said key unit has been inserted into said key unit receptacle, to cause said one shot to fire to thereby open the analog gate means and allow the outputs of said tone generators to activate said speaker means; and
a plurality of ultrasonic sound receivers, one each connected between said power source and each power outlet in said room each receiver means including microphone means, input amplifier means, two separate tone decoders biased only to detect two tone frequencies generated by said transmitter, a flip flop, and a relay controlled by the state of said flip flop, said relay acting to switchably enable power to be coupled to said power outlet means, said microphone being arranged to detect said sounds emanating from said speaker and to output a signal in response thereto when activated, said input amplifier means acting to amplify and couple said signal to said tone decoders, said decoders being connected together such that only if both detect their respective defined frequency tones in said signal will a decoder output signal be produced, and said flip flop changing state in response to said detector output signal, to either activate or deactivate said relay as a function of the prior state of said flip flop.

10. The apparatus of claim 9 further comprising manual reset menas for enabling the initialization of the state of said flip flop, to ensure that power is coupled to said power outlet means only when said key unit is in said key unit receptacle.

11. The apparatus of claim 9 wherein each said tone decoder includes filter means for filtering out signals detected by said microphone that are of a higher frequency and of a shorter duration than those frequencies that said decoders are biased to detect.

12. A method of saving energy comprising the step of:
a. detecting the insertion of a key unit into a key unit receptacle;
b. generating in response thereto ultrasonic sound waves having a plurality of frequency components;
c. detecting the specific frequency components of said generated ultrasonic sound waves; and
d. causing power to be coupled to a power outlet means in response to said detection.

13. The method of claim 12 further comprising the steps of:
e. detecting the removal of said key unit from said key unit receptacle;

f. generating in response thereto ultrasonic sound waves having a plurality of frequency components;

g. detecting the specific frequency components of said generated ultrasonic sound waves; and h. causing power to be decoupled from said power outlet means in response to said detection.

14. The method of claim 13 in which the frequency components asserted upon insertion of said key unit into said key unit receptacle are different from the frequency components asserted upon the removal of said key unit from said receptacle.

* * * * *